United States Patent
Xu et al.

(10) Patent No.: US 8,370,700 B2
(45) Date of Patent: Feb. 5, 2013

(54) CODING METHOD, CODING DEVICE, DECODING METHOD AND DECODING DEVICE FOR LOW DENSITY GENERATOR MATRIX CODE

(75) Inventors: Jin Xu, Shenzhen (CN); Jun Xu, Shenzhen (CN); Zhifeng Yuan, Shenzhen (CN); Yuanli Fang, Shenzhen (CN); Song Li, Shenzhen (CN); Liujun Hu, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 294 days.

(21) Appl. No.: 12/746,181

(22) PCT Filed: Feb. 21, 2008

(86) PCT No.: PCT/CN2008/000378
§ 371 (c)(1),
(2), (4) Date: Jun. 4, 2010

(87) PCT Pub. No.: WO2009/079891
PCT Pub. Date: Jul. 2, 2009

(65) Prior Publication Data
US 2010/0257427 A1    Oct. 7, 2010

(30) Foreign Application Priority Data

Dec. 7, 2007 (CN) .......................... 2007 1 0198973

(51) Int. Cl.
*H03M 13/00* (2006.01)
(52) U.S. Cl. .................. 714/752; 714/786; 714/802
(58) Field of Classification Search .................. 714/752, 714/786, 801
See application file for complete search history.

(56) References Cited

U.S. PATENT DOCUMENTS

| | | | | |
|---|---|---|---|---|
| 7,222,284 | B2 * | 5/2007 | Stolpman | 714/774 |
| 7,757,150 | B2 * | 7/2010 | Stolpman | 714/752 |
| 7,774,675 | B1 * | 8/2010 | Matache et al. | 714/755 |
| 7,831,895 | B2 * | 11/2010 | Lin | 714/800 |
| 7,934,146 | B2 * | 4/2011 | Stolpman | 714/800 |
| 8,086,929 | B2 * | 12/2011 | Chung et al. | 714/752 |
| 2007/0038916 | A1 | 2/2007 | Mittelsteadt et al. | |
| 2007/0245211 | A1 | 10/2007 | Kim et al. | |
| 2009/0164864 | A1 | 6/2009 | Matsumoto et al. | |

FOREIGN PATENT DOCUMENTS

| | | |
|---|---|---|
| CN | 1855730 A | 11/2006 |
| CN | 1953335 A | 4/2007 |
| WO | 2006001666 A2 | 1/2006 |
| WO | 2007072721 A1 | 6/2007 |
| WO | 2007080827 A1 | 7/2009 |

OTHER PUBLICATIONS

Notification of the First Office Action of Chinese application No. 200710198973.0, issued on Jan. 22, 2010.
Supplementary European Search Report in European application number: 08714836.7, mailed on Jul. 11, 2011.
International Search Report in international application No. PCT/CN2008/000378, mailed on Jul. 17, 2008, visible in IFW indexed as "P.Pamphlet".
English Translation of the Written Opinion of the International Search Authority in international application No. PCT/CN2008/000378, mailed on Jul. 17, 2008.
Comparison of Structured LDPC Codes and 3GPP Turbo Codes,—Aug. 2005.
LDGM Codes for Channel Coding and Joint Source-Channel Coding of Correlated Sources,—Jan. 2005.
Design and Evaluation of a Low Density Generator Matrix(LDGM) Large Block FEC Codec,—Sep. 2003.
On Construction of Concatenated Low-Density Generator Matrix Codes,—Aug. 2007.
Efficient Encoding of Low-density Parity-Check Codes—Feb. 2001.
Rate-Compatible LDPC codes with Low Complexity Encoder & Decoder. R1-051383—Nov. 2005.
Ming, Xiao et al. On Analysis and Design of Low Density Generator Matrix Codes for Continuous Phase Podulation. IEEE Transactions on wireless communications,—Sep. 2007.

* cited by examiner

*Primary Examiner* — Esaw Abraham

(74) *Attorney, Agent, or Firm* — Oppedahl Patent Law Firm LLC

(57) ABSTRACT

The present invention discloses a coding method, a coding device, a decoding method and a decoding device for low density generator matrix codes. Wherein the coding method includes: constructing the mother code set of the low density generator matrix code using P low density generator matrix codes of different code lengths at a code rate $R_0$, wherein the mother code set of the low density generator matrix code has a uniform basic matrix $G_b^{uniform}$, $$R_0 = \frac{k_b}{n_b},$$

where $k_b$ is the row number of the basic matrix and $n_b$ is the column number of the basic matrix; obtaining the length L of an intermediate variable according to the relationship between the length K of the information bit sequence to be coded in the mother code set of the low density generator matrix code and the length L of the intermediate variable; obtaining an expansion factor $z_k$ for processing the basic matrix using the length L of the intermediate variable and the row number $k_b$ of the basic matrix, and obtaining a generator matrix $G_{ldgc}$ by modifying and expanding the basic matrix using the expansion factor $z_k$; and coding the information bit sequence to be coded using a matrix $G_{ldgc}(1:L,1:N+L-K)$ comprised of L rows and the first $N+L-K$ columns of the generator matrix.

33 Claims, 8 Drawing Sheets

CODING METHOD, CODING DEVICE, DECODING METHOD AND DECODING DEVICE FOR LOW DENSITY GENERATOR MATRIX CODE

TECHNICAL FIELD

The present invention relates to the field of communications, and more specifically to a coding method, a coding device, a decoding method and a decoding device for low density generator matrix codes.

BACKGROUND

An erasure channel is an important channel model. For example, a file is based on packet communication when it is transmitted over an internet, and generally each packet is either received by a receiving end with no error or is not received at all by the receiving end. In the transmission control protocol (TCP), an approach to network packet loss is an error detection and retransmission mechanism, i.e. utilizing a feedback channel from an input end to an output end to control packets that need to be retransmitted. When the receiving end has detected packet loss, it generates a retransmission control signal until it correctly receives the complete packet; when the receiving end has received the packet, it generates a receipt acknowledgement signal likewise. The sending end also tracks each packet until it receives a notification signal which is fed back, otherwise it will perform retransmission.

A data broadcast service based on a flow mode and a file download mode is a point-to-multipoint service that does not allow feedback, so the traditional error detection and retransmission mechanism can not be used, and therefore it is required to use forward error correction (FEC) to ensure reliable transmission. The classic application layer FEC comprises RS codes (reed-solomon codes) and digital fountain codes, etc. The complexity of coding and decoding RS codes is high, which generally is only suitable for scenarios where the code length is smaller. LT codes (Luby transform codes) and raptor codes are two kinds of practically applicable digital fountain codes. Having linear coding and decoding time, the LT codes show a substantial improvement relative to the RS codes, while the raptor codes offer a much higher decoding efficiency because of the use of a precoding technology. The raptor codes are used as the FEC coding scheme in 3GPP's multimedia broadcast/multicast service (MBMS) and digital video broadcasting (DVB).

A low density generator matrix code (LDGC) is a linear block code, and nonzero elements in its generator matrix are generally sparse. Meanwhile, the LDGC is also a system code, a square matrix formed by the first k columns of its generator matrix is generally an upper triangular matrix or a lower triangular matrix, and the inversion of the matrix can be accomplished by an iteration method. The coding of the LDGC involves first determining an intermediate variable based on the corresponding relationship between an information bit and the intermediate variable in system codes, and then obtaining a coded code word by multiplying the intermediate variable with the generator matrix. The decoding process of the LDGC involves first using the generator matrix to determine an intermediate variable, and then determining an information bit according to the transformation relationship between the information bit and the intermediate variable. The coding complexity of the LDGC is far lower than that of the raptor code, so the LDGC can support coding of any information packet length and any code rate and offer a performance similar to the raptor code, and both can be close to the theoretical optimum performance.

Compared to the structured low density generator matrix code (LDGC), the LT code does not support the coding form of system codes, therefore it is hard for the LT code to meet some practical FEC coding requirements; the raptor code supports system codes, but the raptor code requires a separate precoding process, i.e. it requires a precoding matrix, therefore its coding complexity is higher, whereas the LDGC directly uses the generator matrix to code without the need of an extra precoding matrix, plus the LDGC coding utilizes a back substitution method to solve an upper triangular (or a lower triangular) equation, and therefore its coding complexity is far lower than that of the raptor code. In a word, compared to the LT code, the LDGC has the advantage of supporting system codes; compared to the raptor code, the LDGC has the advantage of offering a lower coding complexity.

SUMMARY

In view of the above-mentioned one or more problems, the present invention provides a coding method for structured low density generator matrix codes.

A coding method for low density generator matrix codes according to embodiments of the present invention, includes the following steps: step I, constructing a mother code set of low density generator matrix codes by using P low density generator matrix codes of different code lengths at a code rate $R_0$, wherein the mother code set of low density generator matrix codes has a uniform basic matrix $G_b^{uniform}$, $$R_0 = \frac{k_b}{n_b},$$

$k_b$ is a row number of the basic matrix, and $n_b$ is a column number of the basic matrix; step II, obtaining a length L of an intermediate variable according to the relationship between a length K of a to-be-coded information bit sequence in the mother code set of low density generator matrix codes and the length L of the intermediate variable; step III, obtaining an expansion factor $z_k$ used for processing the basic matrix by utilizing the length L of the intermediate variable and the row number $k_b$ of the basic matrix, and obtaining a generator matrix $G_{ldgc}$ by modifying and expanding the basic matrix by the expansion factor $z_k$; and step IV, coding the to-be-coded information bit sequence by using a matrix $G_{ldgc}(1:L,1:N+L-K)$ formed by L rows and the first N+L-K columns of the generator matrix.

Wherein in the step II, the length L of the intermediate variable may be obtained by using the length K of the to-be-coded information bit sequence through a formula L=modify(a×K+b), wherein modify( ) may mean rounding modification, the modification method may be ceil, floor or round, a may be a positive rational number slightly greater than 1, and b may be a positive integer.

Wherein the step III may include the following steps: step a, obtaining an expansion factor $Z_t$ by using the length L of the intermediate variable and the row number $k_b$ of the basic matrix through a formula $$z_t = \frac{L}{k_b},$$

and finding out the expansion factor $z_k$ from an expansion factor set Zset that corresponds to the mother code set of low density generator matrix codes and consists of P greater-than-zero positive integers $z_1<z_2<\ldots<z_{k-1}<z_k<\ldots<z_p$, where the expansion factor $z_k$ is used for processing the basic matrix and has the following relationship with the expansion factor $z_1$: $z_{k-1}<z_l\leq z_k$; step b, obtaining a modified basic matrix $G_b^{modified}$ by modifying the basic matrix using the expansion factor $z_k$ used for processing the basic matrix; step c, obtaining an unmodified generator matrix G' by expanding the modified basic matrix using the expansion factor $z_k$ used for processing the basic matrix; and step d, obtaining the generator matrix $G_{ldgc}$ by modifying the unmodified generator matrix G'.

Wherein the step IV may include the following steps: step e, generating an information bit sequence m of length L by adding L−K known bits to the to-be-coded information bit sequence; step f, obtaining an intermediate variable I by using a square matrix $G_{ldgc}(1:L,1:L)$ formed by L rows and the first L columns of the generator matrix and the information bit sequence m of length L according to a formula $I\times G_{ldgc}(1:L,1:L)=m$, and generating a first coding result of length N+L−K by coding the intermediate variable using the matrix $G_{ldgc}(1:L,1:N+L-K)$ formed by L rows and the first N+L−K columns of the generator matrix according to a formula $C=I\times G_{ldgc}$; and step g, generating a second coding result of length N by deleting the L−K known bits from the first coding result of length N+L−K.

Wherein the row number $k_b$ of the basic matrix may be an integer greater than 2, and the column number $n_b$ of the basic matrix may be an integer greater than or equal to 1. In the step d, the generator matrix $G_{ldgc}$ is obtained by increasing column weight of certain columns of the unmodified generator matrix G'.

A coding device for low density generator matrix codes according to embodiments of the present invention, includes: a basic matrix storage unit, which is used to store a uniform basic matrix $G_b^{uniform}$ of a mother code set of low density generator matrix codes constructed by P low density generator matrix codes of different code lengths at a code rate $R_0$, wherein $$R_0 = \frac{k_b}{n_b},$$

$k_b$ is a row number of the basic matrix, and $n_b$ is a column number of the basic matrix; a matrix parameter calculation unit, which is used to calculate a length L of an intermediate variable according to the relationship between a length K of a to-be-coded information bit sequence in the mother code set of low density generator matrix codes and the length L of the intermediate variable, to calculate an expansion factor $z_k$ used for processing the basic matrix by utilizing the length L of the intermediate variable and the row number $k_b$ of the basic matrix, and to obtain a generator matrix $G_{ldgc}$ by performing modification and expansion calculations to the basic matrix using the expansion factor $z_k$; a bit stuffing unit, which is used to generate an information bit sequence m of length L by adding L−K known bits to the to-be-coded information bit sequence; a precoding unit, which is used to obtain an intermediate variable I by using a square matrix $G_{ldgc}(1:L,1:L)$ formed by L rows and the first L columns of the generator matrix and the information bit sequence m of length L according to a formula $I\times G_{ldgc}(1:L,1:L)=m$; a block code coding unit, which is used to generate a first coding result of length N+L−K by coding the intermediate variable using a matrix $G_{ldgc}(1:L,1:N+L-K)$ formed by L rows and the first N+L−K columns of the generator matrix; and a bit deletion unit, which is used to generate a second coding result of length N by deleting the L−K known bits from the first coding result of length N+L−K. Wherein a square matrix $G_b^{uniform}(1:k_b,1:k_b)$ formed by $k_b$ rows and the first $k_b$ columns of the basic matrix may be an upper triangular or a lower triangular matrix.

Wherein the matrix parameter calculation unit may obtain an expansion factor $Z_t$ by using the length L of the intermediate variable and the row number $k_b$ of the basic matrix through a formula $$z_t = \frac{L}{k_b},$$

and obtain the $z_k$ used for processing the basic matrix by finding out the expansion factor that has the following relationship with the expansion factor $Z_t$ from an expansion factor set Zset that corresponds to the mother code set of low density generator matrix codes and consists of P greater-than-zero positive integers $z_1<z_2<\ldots<z_{k-1}<z_k<\ldots<z_p:z_{k-1}<z_t\leq z_k$.

Wherein the matrix parameter calculation unit may obtain a modified basic matrix $G_b^{modified}$ by modifying the basic matrix using the expansion factor $z_k$ used for processing the basic matrix, obtain an unmodified generator matrix G' by expanding the modified basic matrix using the expansion factor $z_k$ used for processing the basic matrix, and then obtain the generator matrix $G_{ldgc}$ by modifying the unmodified generator matrix G'.

Wherein the matrix parameter calculation unit may modify the unmodified generator matrix G' by increasing column weight of certain columns of the unmodified generator matrix G'.

A decoding method for low density generator matrix codes according to embodiments of the present invention, includes the following steps: step I, obtaining a reception generator matrix $G_{ldgc}(:, r1, r2, \ldots ri)$ by modifying and expanding a basic matrix $G_b^{uniform}$ using an expansion factor $z_k$ that is used during a coding process; step II, obtaining a to-be-decoded low density generator matrix code $C(r1, r2, \ldots ri)=[Cr1, Cr2, Cr3, \ldots, Cri]$ by filling L−K known bits in a coded low density generator matrix code that has passed an erasure channel, wherein i is a positive integer satisfying $L\leq i\leq N+L-K$, L is a length of an intermediate variable that is used during the coding process, N is a length of a coded low density generator matrix code that has not passed the erasure channel, and K is a length of a prior-to-coding low density generator matrix code; step III, obtaining a 1*L reception intermediate vector I using the reception generator matrix and the to-be-decoded low density generator matrix code according to a formula $C(:, r1, r2, \ldots ri)=I*G_{ldgc}(:, r1, r2, \ldots ri)$; step IV, obtaining a decoding result m of length L using a square matrix $G_{ldgc}(1:L,1:L)$ formed by L rows and the first L columns of the reception generator matrix and the reception intermediate vector according to a formula $I*G_{ldgc}(1:L,1:L)=m$; and step V, obtaining a decoding result of length K by deleting the L−K known bits from the decoding result m of length L.

Wherein the reception generator matrix may have retained column vectors which corresponds to serial numbers of all non-erasure positions in a matrix $G_{ldgc}(1:L,1:N+L-K)$ formed by L rows and the first N+L−K columns of a generator matrix used during the coding process.

Wherein the step III may include the following steps: step a, obtaining a matrix comprising an L*L upper triangular matrix by performing row permutation, column permutation and/or row cancellation calculations to the reception generator matrix $G_{ldgc}(:, r1, r2, \ldots ri)$ by employing a Gauss elimination method; step b, performing permutation and superposition to the to-be-decoded low density generator matrix code and performing permutation to the intermediate variable used during the coding process based on the matrix comprising the L*L upper triangular matrix; and step c, obtaining the reception intermediate vector I by solving the upper triangular recursion equation based on a back substitution method.

Wherein the step a may include the following steps: selecting a row of the smallest row weight in the reception generator matrix to perform row exchange with the $j^{th}$ row; performing column exchange between a column where the first nonzero element of the $j^{th}$ row in the after-row-exchange reception generator matrix resides and the $j^{th}$ column of the after-row-exchange reception generator matrix; and using elements of the $j^{th}$ row and the $j^{th}$ column of the after-column-exchange reception generator matrix to eliminate the nonzero elements between the $(j+1)^{th}$ row and the last row in the $j^{th}$ column of the after-column-exchange reception generator matrix by employing the row cancellation method.

A decoding device for low density generator matrix codes according to embodiments of the present invention, includes: a basic matrix storage unit, which is used to store a uniform basic matrix $G_b^{uniform}$ of a mother code set of low density generator matrix codes constructed by P low density generator matrix codes of different code lengths at a code rate $R_0$, wherein $$R_0 = \frac{k_b}{n_b},$$

$k_b$ is a row number of the basic matrix, and $n_b$ is a column number of the basic matrix; a matrix parameter calculation unit, which is used to obtain a reception generator matrix $G_{ldgc}(:, r1, r2, \ldots ri)$ by modifying and expanding the basic matrix $G_b^{uniform}$ using an expansion factor $z_k$ used during a coding process; a bit stuffing unit, which is used to obtain a to-be-decoded low density generator matrix code $C(r1, r2, \ldots ri)=[Cr1, Cr2, Cr3, \ldots, Cri]$ by filling L−K known bits in a coded low density generator matrix code that has passed an erasure channel, wherein i is a positive integer satisfying $L \leq i \leq N+L-K$, L is a length of an intermediate variable used during the coding process, N is a length of a coded low density generator matrix code that has not passed the erasure channel, and K is a length of a prior-to-coding low density generator matrix code; an upper triangular matrix calculation unit, which is used to obtain a matrix comprising an L*L upper triangular matrix by performing row permutation, column permutation and/or row cancellation calculations to the reception generator matrix $G_{ldgc}(:, r1, r2, \ldots ri)$ by employing a Gauss elimination method; an intermediate variable calculation unit, which is used to obtain a 1*L reception intermediate vector I using the matrix comprising the L*L upper triangular matrix and the to-be-decoded low density generator matrix code according to a formula $C(:, r1, r2, \ldots ri)=I*G_{ldgc}(:, r1, r2, \ldots ri)$; a block code decoding unit, which is used to obtain a decoding result m of length L using a square matrix $G_{ldgc}(1:L,1:L)$ formed by L rows and the first L columns of the reception generator matrix and the reception intermediate vector according to a formula $I*G_{ldgc}(1:L, 1:L)=m$; and a bit deletion unit, which is used to obtain a decoding result of length K by deleting the L−K known bits from the decoding result m of length L.

Wherein the matrix parameter calculation unit may obtain an expansion factor $Z_t$ utilizing the length L of the intermediate variable used during the coding process and the row number $k_b$ of the basic matrix through a formula $$z_t = \frac{L}{k_b},$$

and obtain the expansion factor $z_k$ used during the coding process by finding out the expansion factor that has the following relationship with the expansion factor $Z_t$ from an expansion factor set Zset that corresponds to the mother code set of low density generator matrix codes and consists of P greater-than-zero positive integers $z_1 < z_2 < \ldots < z_{k-1} < z_k < \ldots < z_p: z_{k-1} < z_t \leq z_k$.

Wherein the matrix parameter calculation unit may obtain a modified basic matrix $G_b^{modified}$ by modifying the basic matrix using the expansion factor $z_k$ used during the coding process, obtain a basic generator matrix G by expanding the modified basic matrix using the expansion factor $z_k$ used during the coding process, and then generate the reception generator matrix using L rows and columns corresponding to the serial numbers of the to-be-decoded low density generator matrix codes of the basic generator matrix G.

Wherein the upper triangular matrix calculation unit may obtain the matrix comprising the L*L upper triangular matrix by selecting a row with the smallest row weight in the reception generator matrix to perform row exchange with the $j^{th}$ row, performing column exchange between a column where the first nonzero element of the $j^{th}$ row in an after-row-exchange reception generator matrix resides and the $j^{th}$ column of the after-row-exchange reception generator matrix, and using elements of the $j^{th}$ row and the $j^{th}$ column of the after-column-exchange reception generator matrix to eliminate the nonzero elements between the $(j+1)^{th}$ row and the last row in the $j^{th}$ column of the after-column-exchange reception generator matrix by employing the row cancellation method.

Wherein under circumstances that the square matrix $G_{ldgc}(1:L,1:L)$ formed by L rows and the first L columns of the reception generator matrix may be an upper-left triangular matrix or a lower-left triangular matrix, the L−K known bits may be filled before the coded low density generator matrix code that has passed the erasure channel. Wherein under circumstances that the square matrix $G_{ldgc}(1:L,1:L)$ formed by L rows and the first L columns of the reception generator matrix is an upper-right triangular matrix or a lower-right triangular matrix, the L−K known bits may be filled after K−E bits of the coded low density generator matrix code that has passed the erasure channel, wherein E may be the number of erased code words in the first K code words after the coded low density generator matrix code that has not passed the erasure channel passes the erasure channel.

The present invention can improve the code length flexibility of the low density generator matrix code and reduce the storage space of the basic matrix, thereby decreasing the coding and decoding complexity.

BRIEF DESCRIPTION OF THE DRAWINGS

The drawings described here are used to provide further understanding for the present invention and constitute a part of the present invention, and the examplary embodiments of the present invention and the descriptions are used to explain the present invention and do not constitute any improper limitation to the present invention. In the drawings.

DETAILED DESCRIPTION

Figure 1:
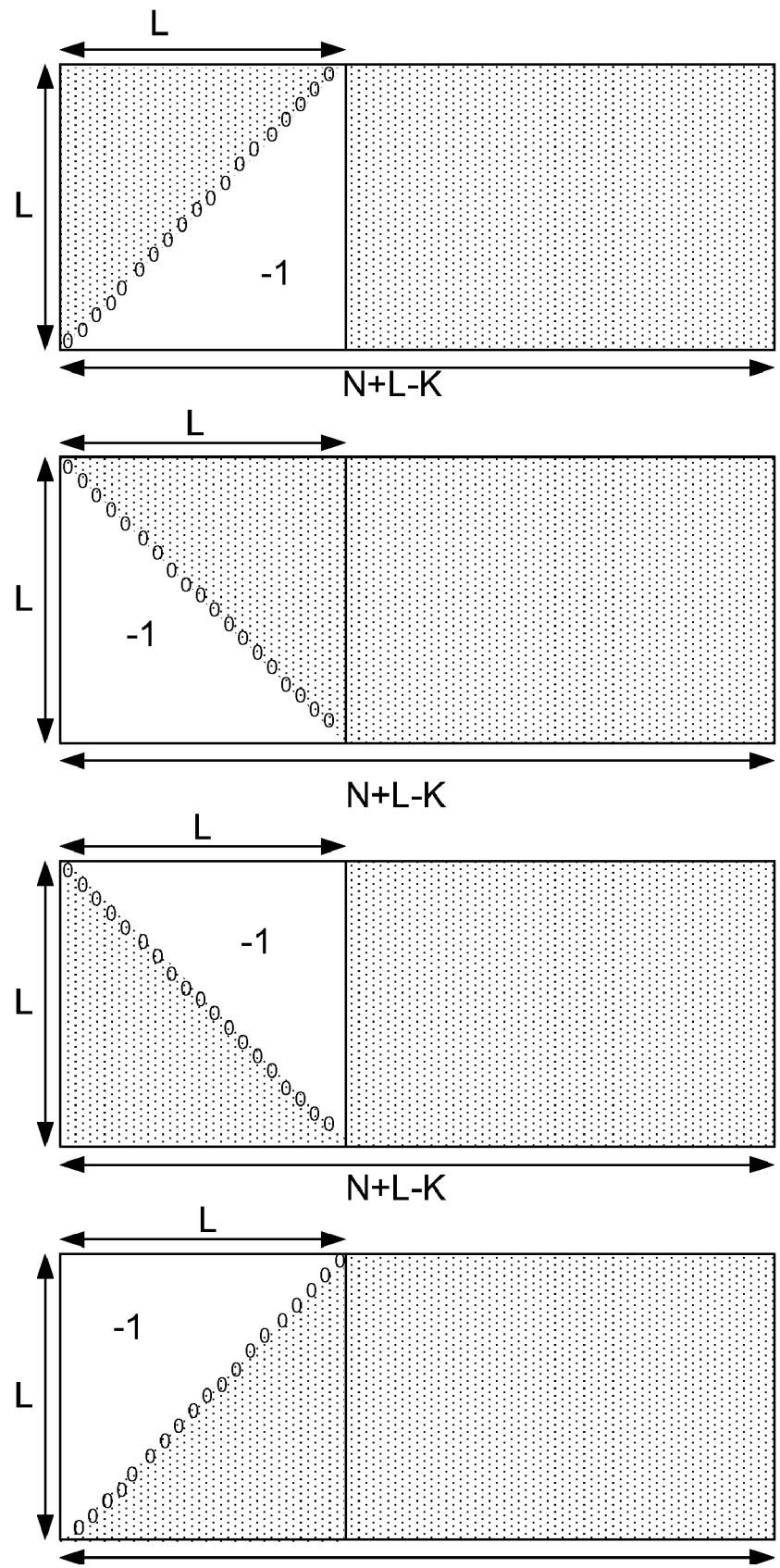
FIG. 1 is an illustration of upper and lower triangular basic matrices.

A coding method for LDGCs proposed in the present invention can adapt to different code lengths, has a simple formulation, is advantageous for standardization and favorable for the storage of basic matrix, therefore offering greater versatility. Assuming that a generator matrix G of the LDGCs is a (K×z)×(N×z) matrix, which consists of K×N partitioned matrices, and each partitioned matrix is a different power of a z×z basic permutation matrix. When the basic permutation matrix is an identity matrix, the partitioned matrices are all cyclic shift matrices of the identity matrix (right shift by default in the text), the form is as follows: if $g_{ij}^b = -1$, then $P^{g_{ij}^b} = 0$; if $g_{ij}^b$ is an integer greater than or equal to 0, then $P^{g_{ij}^b} = (P)^{g_{ij}}$ is defined, wherein P is a z×z standard permutation matrix, as shown below:

$$P = \begin{bmatrix} 0 & 1 & 0 & \cdots & 0 \\ 0 & 0 & 1 & \cdots & 0 \\ \cdots & \cdots & \cdots & \cdots & \cdots \\ 0 & 0 & 0 & \cdots & 1 \\ 1 & 0 & 0 & \cdots & 0 \end{bmatrix}.$$

Each partitioned matrix can be uniquely identified through such a power $g_{ij}^b$, the power of an identity matrix can be denoted by 0, and a zero matrix is generally expressed by −1. In this way, if every partitioned matrix of G is replaced with its power, then we can get a $k_b \times n_b$ power matrix $G_b$. Here, $G_b$ is defined as the basic matrix of G, and G is called the expanded matrix of $G_b$. During the actual coding process, z=code length/column number $n_b$ of the basic matrix, which is called an expansion factor.

For example, the matrix G can be obtained by using the following parameter z and by expanding a 2×4 basic matrix $G_b$: z=3 and $$G_b = \begin{bmatrix} 0 & 1 & 0 & -1 \\ 2 & 1 & 2 & 1 \end{bmatrix},$$

$$G = \begin{bmatrix} 1 & 0 & 0 & 0 & 1 & 0 & 1 & 0 & 0 & 0 & 0 & 0 \\ 0 & 1 & 0 & 0 & 0 & 1 & 0 & 1 & 0 & 0 & 0 & 0 \\ 0 & 0 & 1 & 1 & 0 & 0 & 0 & 0 & 1 & 0 & 0 & 0 \\ 0 & 0 & 1 & 0 & 1 & 0 & 0 & 0 & 1 & 0 & 1 & 0 \\ 1 & 0 & 0 & 0 & 0 & 1 & 1 & 0 & 0 & 0 & 0 & 1 \\ 0 & 1 & 0 & 1 & 0 & 0 & 0 & 1 & 0 & 1 & 0 & 0 \end{bmatrix}.$$

Therefore, that is to say that an encoder for LDGCs in the present invention is uniquely generated using the basic matrix $G_b$, the expansion factor z and the selected basic permutation matrix.

If the LDGC always uses a same basic matrix for every different expansion factor, then the LDGC codec would always need to store a basic matrix for every different code length, and even has to store many basic matrices when there are many code lengths. Such a situation would result in presentation and storage problems. For this reason, when it is necessary to realize variable code lengths, the low density generator matrix codes of multiple code lengths at a same code rate within a certain range will use a basic matrix in a uniform form, which is defined here as a uniform basic matrix $G_b^{uniform}$. For different code lengths, if $G_b^{uniform}$ is modified and expanded, then the generator matrix G can be obtained to make the generated codec suitable for situations of variable code lengths.

Modification is modifying nonnegative values in the basic matrix $G_b$ by using expansion factors of different code lengths, and the value of a modified element should be smaller than the value of the expansion factor under such a code length. There are many modification algorithms, for example, it is practical to use a mod operation, a scale+floor operation or a scale+round operation, etc. Assuming that $P_{ij}$ is a non-negative 1 element in the $i^{th}$ row and $j^{th}$ column of the basic matrix $G_b$, and $P'_{ij}$ is the non-negative 1 element in the $i^{th}$ row and $j^{th}$ column of the modified matrix $G_b^{modified}$ then: as to the mod method, $$P'_{ij} \equiv P_{ij} \bmod z \equiv P_{ij} \bmod \frac{N}{n_b};$$

as to the scale+floor method, $$P'_{ij} = \left\lfloor P_{ij} \times \frac{z}{z_{max}} \right\rfloor = \left\lfloor P_{ij} \times \frac{N}{N_{max}} \right\rfloor;$$

as to the scale+round method, $$P'_{ij} = \text{Round}\left(P_{ij} \times \frac{z}{z_{max}}\right) = \text{Round}\left(P_{ij} \times \frac{N}{N_{max}}\right).$$

Wherein z is the expansion factor to which the current code length corresponds, i.e. the row number or column number of a partitioned square matrix; $z_{max}$ is the expansion factor to which a maximum supported code length corresponds. The mod means a modular operation, $\lfloor \ \rfloor$ means a floor operation, and the Round means a rounding operation.

The low density generator matrix code proposed in the present invention is a compiled code that realizes being a low density generator matrix code of any code length by performing such operations to a uniform basic matrix as modification or expansion based on a mother code set of LDGCs of variable code lengths. The specific embodiment of the present invention is described in detail below with reference to the drawings.

Figure 2:
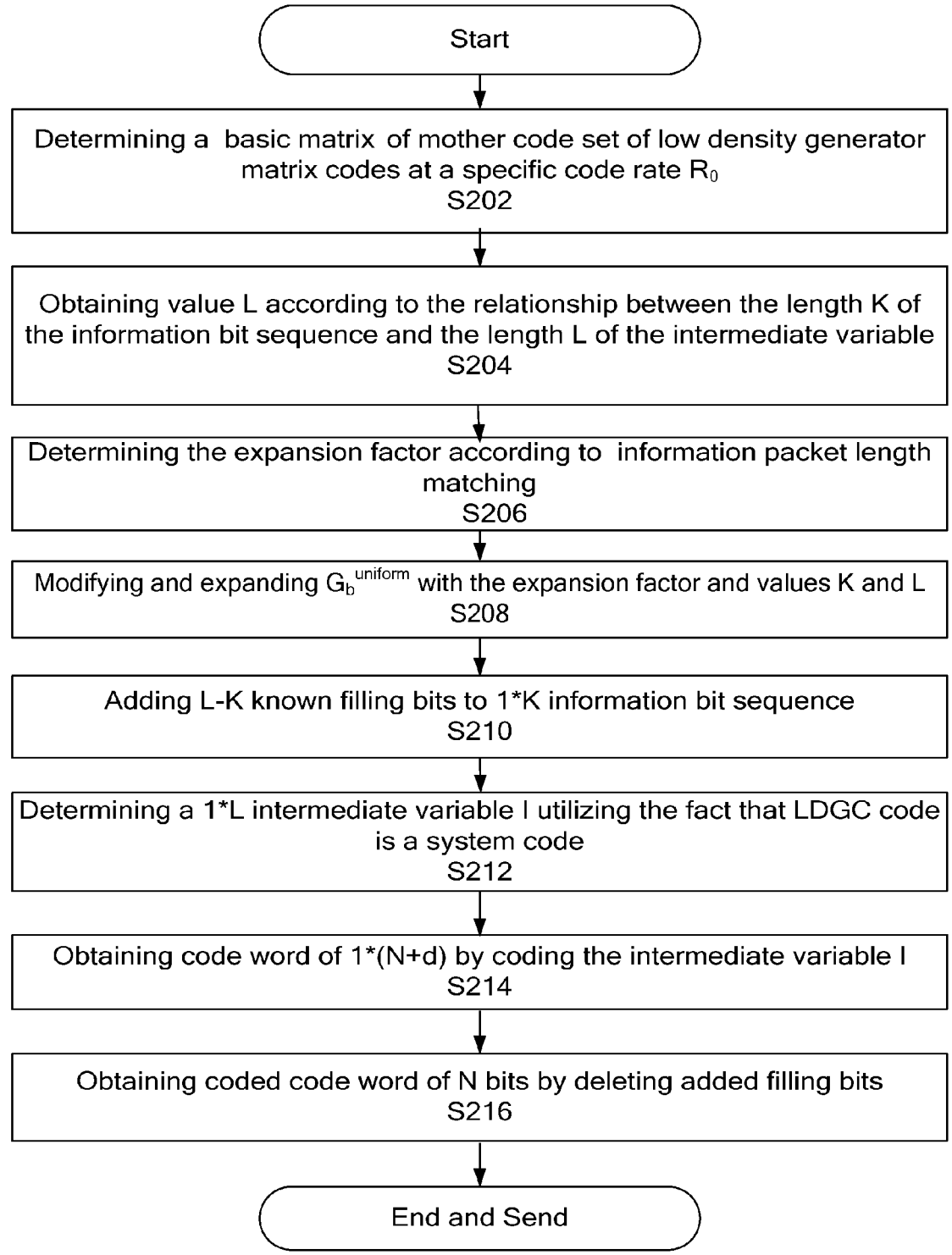
FIG. 2 is a flowchart of a coding method for LDGCs according to embodiments of the present invention.

According to FIG. 2, a coding method for LDGCs according to embodiments of the present invention is illustrated. Wherein the method shown in FIG. 2 is a process of coding an information bit signal flow of length K and then outputting the coded information bit signal flow of length N to a subsequent processing unit for processing. Wherein the length of check bit is M=N−K, and the code rate is r=K/N. As shown in FIG. 2, the method includes the following steps:

S202, determining a uniform basic matrix $G_b^{uniform}$ of the mother code set of low density generator matrix codes at a specific code rate $R_0$. Wherein the mother code set of low density generator matrix codes consists of P low density generator matrix codes of different code lengths (N=z×$n_b$, K=z×$k_b$) at the code rate $R_0$. Wherein $$R_0 = \frac{k_b}{n_b},$$

which is far smaller than the code rate required in actual coding. Zset is an expansion factor set, the expansion factor z can be any element in Zset, and Zset is a set consisting of P greater-than-zero positive integers $z_1 < z_2 < \ldots < z_{k-1} < z_k < \ldots < z_p$. Wherein $n_b$ (a determinate integer greater than 2) is a column number of the basic matrix $G_b^{uniform}$, and $k_b$ (a determinate integer greater than or equal to 1) is a row number of the basic matrix $G_b^{uniform}$. As shown in FIG. 1, a square matrix $G_b^{uniform}(1:k_b,1:k_b)$ formed by $k_b$ rows and the first $k_b$ columns of the basic matrix $G_b^{uniform}$ is a special upper triangular or lower triangular matrix, and all LDGCs at actual code rates greater than $R_0$ can be generated through coding using the basic matrix $G_b^{uniform}$.

S204, obtaining a value L according to the relationship between the length K of the information bit signal flow and the length L of the intermediate variable. Specifically, a certain relationship exists between the length K of the information bit signal flow and the length L of the intermediate variable, i.e. L=modify(a×K+b), wherein modify( ) means rounding modification, and the modification method can be ceil, floor or round. Wherein a is a positive rational number slightly greater than 1, b is a positive integer, and L can be determined based on this relationship.

S206, determining the expansion factor according to information packet length matching in order to determine the parameters and matrices required in coding based on the expansion factor and basic matrix $G_b^{uniform}$. Wherein the expansion factor $z_t$ is determined using the particular expansion factor formula $$z_t = \frac{L}{k_b},$$

and the following relationship is determined to be existing between $z_t$ and elements in Zset: $z_{k-1} < z_t \leq z_k$, wherein $z_{k-1}, z_k$ are adjacent elements in size in Zset, and the expansion factor required in coding is $z_k$.

S208, obtaining a modified basic matrix $G_b^{modified}$ through a particular modification algorithm based on the uniform basic matrix $G_b^{uniform}$ and the expansion factor $z_k$, and obtaining an unmodified generator matrix G' by expanding $G_b^{modified}$ using the expansion factor $z_k$; obtaining the final generator matrix $G_{ldgc}$ by modifying G', where the modification method is increasing the column weight of some columns (i.e. increasing the number of elements 1 in the columns). Wherein the matrix $G_{ldgc}(1:L,1:N+L-K)$ formed by L rows and the first N+L−K columns of the generator matrix $G_{ldgc}$ is the matrix required in coding.

It is necessary to point out that the method for increasing the column weight can be replacing some columns in G' with some separately generated heavier columns, or accumulating other columns of G' into these columns, or directly increasing the number of elements 1 in these columns, and it is not limited to these three methods only, but it must ensure that the square matrix consisting of L rows and the first L columns of the final generator matrix $G_{ldgc}$ is still an upper triangular or a lower triangular matrix.

S210, under the circumstances that the square matrix $G_b^{uniform}(1:k_b,1:k_b)$ formed by $k_b$ rows and the first $k_b$ columns of the basic matrix $G_b^{uniform}$ is an upper-left triangular or a lower-left triangular matrix, generating a new information bit signal flow m of length L by filling L−K known bits prior to the to-be-coded information bit signal flow (information bit s) of K bits; under the circumstances that $G_b^{uniform}(1:k_b,1:k_b)$ is an upper-right triangular or a lower-right triangular matrix, generating a new information bit signal flow m of length L by filling L−K known bits after the to-be-coded information bit signal flow (information bit s) of K bits. It is necessary to point out that the positions of filling bits are not limited to this.

S212, generating an intermediate variable I by using the square matrix $G_{ldgc}(1:L,1:L)$ formed by L rows and the first L columns of the generator matrix $G_{ldgc}$ and the information bit signal flow m of length L according to I×$G_{ldgc}$(1:L,1:L)=m as to the filled information bit signal flow m, because the LDGC is a system code.

S214, generating a coded signal flow of length N+L−K by coding the intermediate variable I using the generator matrix $G_{ldgc}$ according to C=I×$G_{ldgc}$.

S216, generating a coded signal flow of length N by deleting the L−K known bits from the coded signal flow of length N+L−K.

The coding method for low density generator matrix codes according to embodiments of the present invention is described below using an actual example.

First, the modified basic matrix is obtained by modifying the mother code set of low density generator matrix codes. The size of a uniform basic matrix of the structured mother code set of low density generator matrix codes of multiple code lengths at a code rate $R_0$=1/3 is $k_b$×$n_b$=12×36, and the expansion factor of the mother code set increases from $z_{min}$=2 to $z_{max}$=683 in 1 increment, which is expressed as z∈Zset={$z_{min}$:1: $z_{max}$}. Since one particular code length N corresponds to one particular expansion factor z, the information packet length increases from $z_{min}$×$k_b$ to $z_{max}$×$k_b$ in $k_b$ increments, which is expressed as K∈{$z_{min}$×$k_b$:$k_b$:$z_{max}$×$k_b$}={24:12:8196}. The uniform basic matrix $G_b^{uniform}$ of the mother code set at the code rate $R_0$=1/3 is as shown below: $G_b^{uniform}$[$G_b^{system}$|$G_b^{parity}$]. Wherein $G_b^{system} =$ $$\begin{pmatrix}
0 & 255 & -1 & 512 & -1 & -1 & -1 & -1 & -1 & -1 & -1 & -1 \\
-1 & 0 & 658 & -1 & -1 & -1 & 422 & 447 & -1 & 363 & -1 & -1 \\
-1 & -1 & 0 & -1 & -1 & 623 & -1 & -1 & 153 & -1 & -1 & -1 \\
-1 & -1 & -1 & 0 & 628 & 291 & -1 & -1 & -1 & 461 & -1 & -1 \\
-1 & -1 & -1 & -1 & 0 & -1 & -1 & 227 & -1 & -1 & -1 & -1 \\
-1 & -1 & -1 & -1 & -1 & 0 & 320 & -1 & -1 & -1 & -1 & -1 \\
-1 & -1 & -1 & -1 & -1 & -1 & 0 & -1 & 318 & -1 & -1 & -1 \\
-1 & -1 & -1 & -1 & -1 & -1 & -1 & 0 & -1 & -1 & -1 & -1 \\
-1 & -1 & -1 & -1 & -1 & -1 & -1 & -1 & 0 & 198 & -1 & -1 \\
-1 & -1 & -1 & -1 & -1 & -1 & -1 & -1 & -1 & 0 & -1 & -1 \\
-1 & -1 & -1 & -1 & -1 & -1 & -1 & -1 & -1 & -1 & 0 & -1 \\
-1 & -1 & -1 & -1 & -1 & -1 & -1 & -1 & -1 & -1 & -1 & 0
\end{pmatrix}$$

$G_b^{parity} =$ $$\begin{pmatrix}
367 & -1 & -1 & -1 & -1 & 580 & -1 & -1 & -1 & -1 & -1 & -1 & 285 & -1 & 135 & -1 & 593 & 302 & -1 & -1 & 520 & 626 & -1 & -1 \\
-1 & -1 & -1 & -1 & -1 & -1 & 216 & -1 & -1 & -1 & -1 & -1 & -1 & -1 & 410 & 272 & -1 & -1 & -1 & -1 & -1 & -1 & 4 \\
-1 & -1 & 131 & -1 & 330 & -1 & -1 & -1 & -1 & -1 & -1 & 609 & -1 & -1 & 585 & -1 & -1 & -1 & -1 & -1 & 679 & -1 & -1 \\
-1 & -1 & -1 & -1 & -1 & -1 & -1 & -1 & -1 & -1 & -1 & -1 & -1 & -1 & -1 & 168 & -1 & -1 & -1 & -1 & -1 & -1 & -1 \\
-1 & 183 & -1 & 42 & 150 & -1 & -1 & -1 & -1 & -1 & -1 & -1 & -1 & 225 & -1 & -1 & -1 & -1 & 331 & 529 & -1 & -1 & -1 \\
447 & -1 & -1 & 661 & -1 & -1 & -1 & 551 & -1 & -1 & -1 & -1 & -1 & -1 & 582 & -1 & -1 & 502 & -1 & 429 & -1 & -1 & -1 \\
-1 & 374 & -1 & -1 & -1 & -1 & -1 & 464 & -1 & -1 & 478 & -1 & -1 & -1 & -1 & -1 & -1 & -1 & -1 & 545 & -1 & -1 \\
460 & -1 & 541 & -1 & -1 & -1 & -1 & -1 & 66 & -1 & -1 & -1 & -1 & -1 & -1 & -1 & -1 & 165 & -1 & -1 & -1 \\
1 & -1 & -1 & -1 & -1 & -1 & -1 & -1 & -1 & 364 & -1 & -1 & 661 & -1 & -1 & -1 & -1 & 56 & -1 & -1 & -1 & -1 \\
-1 & -1 & 82 & 123 & -1 & 497 & -1 & -1 & 97 & -1 & -1 & -1 & -1 & 605 & 7 & -1 & -1 & -1 & -1 & -1 & 176 & -1 \\
-1 & -1 & -1 & -1 & 327 & 231 & -1 & -1 & -1 & -1 & -1 & -1 & 69 & -1 & -1 & -1 & -1 & 242 & -1 & -1 & -1 & -1 & 266 \\
-1 & 661 & -1 & -1 & -1 & -1 & 168 & 111 & -1 & 133 & 14 & -1 & 332 & -1 & -1 & -1 & -1 & -1 & -1 & -1 & -1 & 389 & -1
\end{pmatrix}$$

There is a 1*K=1*24 binary information bit data flow s (s can be expressed as D8AB13 in hexadecimal system) that needs to generate LDGC coded code words of 72 bits through coding according to the method in embodiments of the present invention, therefore K=24, N=72.

L=48 is determined according to the relationship between the information packet length K and length L of the intermediate variable; the expansion factor $$z_t = \frac{48}{12} = 4$$

is determined using the particular expansion factor formula $$z_t = \frac{L}{k_b},$$

and it can be determined that the following relationship exists between $z_t$ and the elements in Zset: $z_{k-1}=3 < z_t \leq z_k=4$, wherein $z_{k-1}$, $z_k$ are adjacent elements in size in Zset, $z=z_k=4$ is the expansion factor required in coding.

In order to realize the coding and decoding of the (z×$k_b$, z×$n_b$) low density generator matrix codes, it is necessary to use a modification calculation and the expansion factor z as mentioned above to modify the uniform basic matrix $G_b^{uniform}$ to obtain the modified basic matrix $G_b^{modified}$, and the generator matrix can be obtained according to $G_b^{modified}$ and z. This example uses the rounding (Scale+floor) modification formula to modify the uniform basic matrix, and the modification is performed to the elements $(g_{ij}^b)_{uniform}$ of $G_b^{uniform}$ that denote a nonzero square matrix, here $z_{max}$=683:

$$(g_{ij}^b)_{modified} = \left\lfloor (g_{ij}^b)_{uniform} \times \frac{z}{z_{max}} \right\rfloor = \left\lfloor (g_{ij}^b)_{uniform} \times \frac{z}{683} \right\rfloor.$$

By modifying the above-mentioned $G_b^{uniform}$, the modified basic matrix to which the low density generator matrix codes correspond can be obtained, as shown below:

$$G_b^{modified} = \begin{matrix}
0 & 1 & -1 & 2 & -1 & -1 & -1 & -1 & -1 & -1 & -1 & -1 & -1 & 2 & -1 & -1 & -1 & 3 \\
-1 & 0 & 3 & -1 & -1 & -1 & 2 & 2 & -1 & 2 & -1 & -1 & -1 & -1 & -1 & -1 & -1 & -1 \\
-1 & -1 & 0 & -1 & -1 & 3 & -1 & -1 & 0 & -1 & -1 & -1 & -1 & -1 & 0 & -1 & 1 & -1 \\
-1 & -1 & -1 & 0 & 3 & 1 & -1 & -1 & -1 & 2 & -1 & -1 & -1 & -1 & -1 & -1 & -1 & -1 \\
-1 & -1 & -1 & -1 & 0 & -1 & -1 & 1 & -1 & -1 & -1 & -1 & -1 & 1 & -1 & 0 & 0 & -1 \\
-1 & -1 & -1 & -1 & -1 & 0 & 1 & -1 & -1 & -1 & -1 & -1 & 2 & -1 & -1 & 3 & -1 & -1 \\
-1 & -1 & -1 & -1 & -1 & -1 & 0 & -1 & 1 & -1 & -1 & -1 & -1 & 2 & -1 & -1 & -1 & -1 \\
-1 & -1 & -1 & -1 & -1 & -1 & -1 & 0 & -1 & -1 & -1 & -1 & 2 & -1 & 3 & -1 & -1 & -1 \\
-1 & -1 & -1 & -1 & -1 & -1 & -1 & -1 & 0 & 1 & -1 & -1 & 0 & -1 & -1 & -1 & -1 & -1 \\
-1 & -1 & -1 & -1 & -1 & -1 & -1 & -1 & -1 & 0 & -1 & -1 & -1 & -1 & 0 & 0 & -1 & 2 \\
-1 & -1 & -1 & -1 & -1 & -1 & -1 & -1 & -1 & -1 & 0 & -1 & -1 & -1 & -1 & -1 & 1 & 1 \\
-1 & -1 & -1 & -1 & -1 & -1 & -1 & -1 & -1 & -1 & -1 & 0 & -1 & 3 & -1 & -1 & -1 & -1 \\
\end{matrix}$$

$$\begin{matrix}
-1 & -1 & -1 & -1 & -1 & -1 & 3 & -1 & -1 & 1 & -1 & 3 & -1 & 0 & 3 & -1 & -1 & 1 \\
1 & -1 & -1 & -1 & -1 & -1 & 1 & -1 & -1 & -1 & -1 & -1 & -1 & -1 & -1 & 2 & 0 & -1 \\
-1 & -1 & -1 & -1 & -1 & -1 & -1 & -1 & -1 & 3 & -1 & -1 & -1 & -1 & 3 & 3 & -1 & -1 \\
-1 & -1 & -1 & -1 & -1 & -1 & 0 & -1 & -1 & -1 & -1 & -1 & -1 & -1 & -1 & -1 & -1 & -1 \\
-1 & -1 & -1 & -1 & -1 & -1 & -1 & -1 & -1 & -1 & 3 & 1 & 1 & -1 & -1 & -1 & -1 & -1 \\
-1 & 3 & -1 & -1 & -1 & -1 & -1 & -1 & 2 & -1 & -1 & 2 & -1 & -1 & -1 & 3 & -1 & -1 \\
-1 & -1 & 2 & -1 & -1 & 2 & -1 & -1 & -1 & -1 & -1 & -1 & -1 & 3 & -1 & -1 & -1 & -1 \\
-1 & -1 & -1 & 0 & -1 & -1 & -1 & -1 & -1 & -1 & 0 & -1 & -1 & -1 & -1 & -1 & -1 & -1 \\
-1 & -1 & -1 & -1 & 2 & -1 & -1 & 3 & -1 & -1 & -1 & -1 & 0 & -1 & -1 & -1 & -1 & -1 \\
-1 & -1 & 0 & -1 & -1 & -1 & -1 & -1 & -1 & -1 & 1 & -1 & -1 & 3 & -1 & 0 & -1 & -1 \\
-1 & -1 & -1 & -1 & -1 & -41 & -1 & 0 & 1 & -1 & -1 & -1 & -1 & -1 & -1 & -1 & 1 & -1 \\
0 & 0 & -1 & 0 & 0 & -1 & -1 & -1 & -1 & 1 & 2 & -1 & -1 & -1 & -1 & -1 & -1 & -1 \\
\end{matrix}$$

Figure 3:
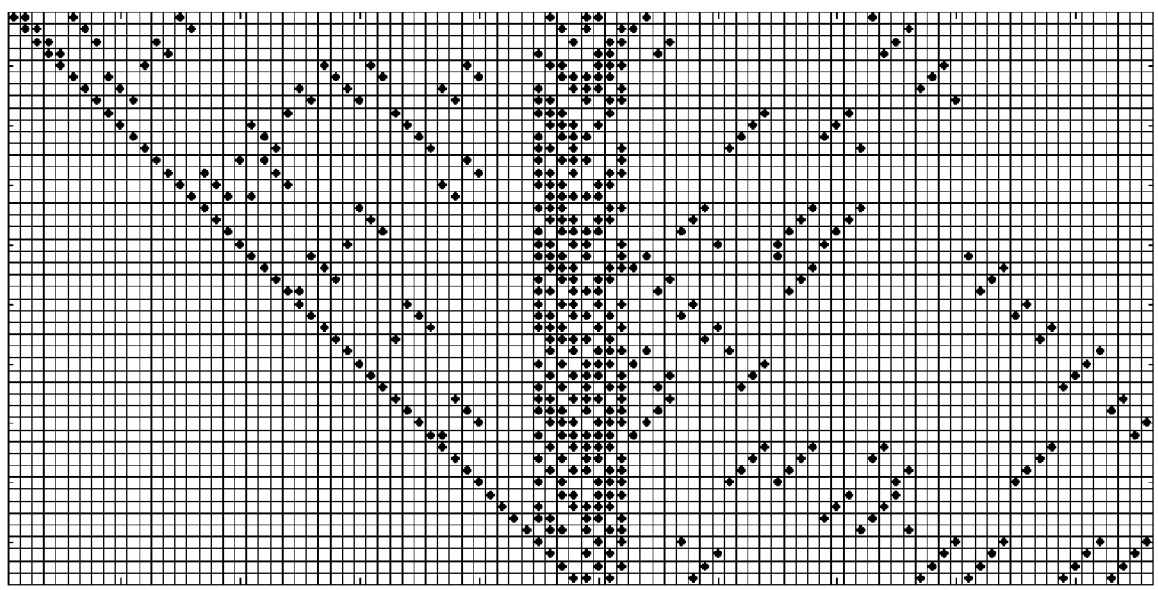
FIG. 3 is an illustration of a generator matrix of LDGCs according to embodiments of the present invention.

L*(N+L−K) generator matrix G' is obtained by expanding $G_b^{modified}$ with the expansion factor $z_k$, and the $(L-z_k=44)^{th}$ to $(L+z_k=52)^{th}$ columns of G' are modified to increase the column weight of G'(:,L−$z_k$:L+$z_k$) (i.e. increasing the number of elements 1 in the column); at the same time, the $1^{st}$ to $z_k^{th}$ columns of G' are also modified to make the column weight of some columns in G' from the $1^{st}$ column to the $z_k^{th}$ column become 2, the modified matrix is $G_{ldgc}(1:L,1:N+L-K)=G_{ldgc}(1:48,1:96)$, which consists of many $z_k*z_k$ square matrices, as shown in FIG. 3 (wherein black dots denote element 1, and blank positions denote element 0).

Since the square matrix $G_b^{uniform}(1:k_b,1:k_b)$ formed by $k_b$ rows and the first $k_b$ columns of the basic matrix $G_b^{uniform}$ is an upper-right triangular matrix, d=L−K=24 known filling bits p (p can be expressed as 9A0C2C in hexadecimal system) are added after an input information flow s to generate the information bit flow m of 1*L=1*48 (m can be expressed as D8AB139A0C2C in hexadecimal system).

A 1*L=1*48 intermediate variable I (I can be expressed as 942DA94E0A24 in hexadecimal system) is determined by performing equation solving calculation to the after-filling information bit flow m of 1*L=1*48 utilizing the fact that $G_{ldgc}(1:L,1:L)=G_{ldgc}(1:48,1:48)$ is an upper-right triangular matrix based on the characteristic that the LDGC is a system code (because the LDGC code is a system code, I×$G_{ldgc}$(1:48,1:48)=m).

A binary code word c of 1*(N+d)=1*96 (c can be expressed as D8AB139A0C2CCD3AC516ED52 in hexadecimal system) is generated by coding the inputted intermediate variable I according to c=I×$G_{ldgc}$.

A coded code word of N=72 bits (which can be expressed as D8AB13CD3AC516ED52 in hexadecimal system) is sent out, which is ultimately obtained by deleting the added d=24 filling bits from the binary code word c of 1*(N+d)=1*96.

Figure 4:
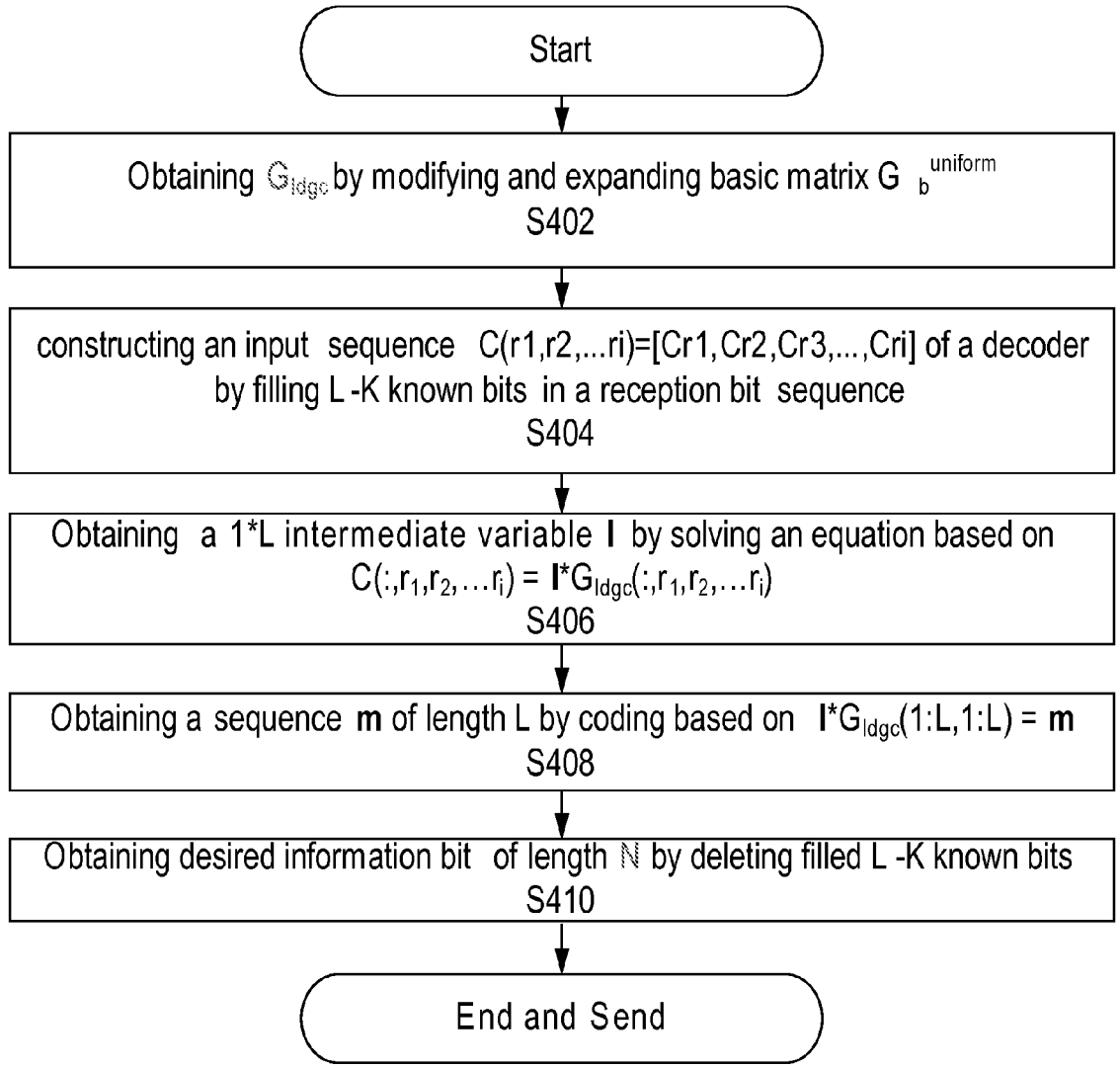
FIG. 4 is a flowchart of a decoding method for LDGCs according to embodiments of the present invention.

According to FIG. 4, a decoding method for LDGCs according to embodiments of the present invention is illustrated. The method as shown in FIG. 4 is designed for an information bit signal flow that has passed an erasure channel, i.e. decoding the information bit signal flow of length K and outputting it to subsequent processing units. Suppose that after passing the erasure channel, E bits of the first K bits are erased. As shown in FIG. 4, the method includes the following steps.

S402, obtaining a reception generator matrix $G_{ldgc}(:,r_1, r_2, \ldots r_i)$ by modifying and expanding a basic matrix $G_b^{uniform}$. Wherein for the specific method, please refer to the corresponding steps in the coding method.

S404, filling L−K known bits in the reception bit signal flow that has passed the erasure channel to construct an input signal flow $C(r_1, r_2, \ldots r_i)=[C_{r1}, C_{r2}, C_{r3}, \ldots, C_{ri}]$ of the decoder, wherein i is a positive integer and L≦i≦N+L−K. Wherein under the circumstances that the square matrix $G_{ldgc}(1:L,1:L)$ formed by L rows and the first L columns of the generator matrix used during the coding process is an upper-left triangular or a lower-left triangular matrix, the L−K known bits are filled prior to the reception bit signal flow; under the circumstances that the square matrix $G_{ldgc}(1:L,1:L)$ formed by L rows and the first L columns of the generator matrix used during the coding process is an upper-right triangular or a lower-right triangular matrix, the L−K filling bits are added after the (K−E)$^{th}$ bit in the reception bit signal flow. It is necessary to point out that the positions of filling bits are not limited to this.

S406, obtaining the 1*L intermediate variable I by solving the equation according to $C(:,r_1, r_2, \ldots r_i)=I*G_{ldgc}(:,r_1, r_2, \ldots r_i)$. Wherein $G_{ldgc}(:,r_1, r_2, \ldots r_i)$ denotes the reception generator matrix $G_{ldgc}(:,r_1, r_2, \ldots r_i)$ that corresponds to received information bits, and the matrix has retained the column vectors which correspond to serial numbers of all non-erasure positions in the generator matrix $G_{ldgc}(1:L,1:N+L-K)$ used during the coding process. Specifically, the process of calculating the intermediate variable I includes the following steps: generating an L*L upper triangular matrix in the matrix employing a special Gauss elimination method; performing permutation and superposition to reception code words based on row permutation and row cancellation calculations to a matrix comprising the L*L upper triangular matrix; performing permutation to the intermediate variable based on column permutation calculations to the matrix comprising the L*L upper triangular matrix; and ultimately obtaining the intermediate variable I by solving an upper triangular recursion equation using a back substitution method. Wherein the process of generating the matrix comprising the L*L upper triangular matrix employing the Gauss elimination method and the recursion method includes the following steps: selecting a row with the smallest row weight (the number of elements 1 in the row) in $G_{ldgc}(j:L, r_1, r_2, \ldots r_i)$ to perform row exchange with the $j^{th}$ row; performing column exchange between a column where the first nonzero element of the $j^{th}$ row resides and the $j^{th}$ column of the matrix; and using elements of the $j^{th}$ row and the $j^{th}$ column to eliminate the nonzero elements between the $(j+1)^{th}$ row and the last row in the $j^{th}$ column by employing the row cancellation method. Wherein if it is ultimately not capable of generating the matrix comprising the L*L upper triangular matrix, then it means that equation solving has failed.

S408, obtaining the signal flow m of length L according to $I*G_{ldgc}(1:L,1:L)=m$.

S410, obtaining the desired information bit of length N by deleting the filled L−K known bits.

The decoding method for low density generator matrix codes according to embodiments of the present invention is explained below using an actual example.

First, the mother code set of low density generator matrix codes is modified and expanded, where the modification and expansion methods are the same as those for coding, and the obtained modified basic matrix and expanded generator matrix are the same as those during coding. For decoding of code words at a particular code rate $R_0=1/3$ and of information packet length K=24, the basic matrix $G_b^{modified}$ and the generator matrix $G_{ldgc}$ used at a decoding end are the same as those at a coding end.

There is a binary bit flow c' of the information packet length K=24 that arrives at the decoding end after passing the erasure channel, c' can be expressed as D(X)AB13CD3(X)C516ED52 in hexadecimal system, wherein (X) denotes that the bit in the position has been erased, E=4 bits among K=24 information packet bits have been erased, and the erasure positions are the $5^{th}$, $6^{th}$, $7^{th}$ and $8^{th}$ bit. Because $G_b^{modified}$ is an upper-right triangular matrix, a new reception code word flow c is constructed by adding L−K=24 known bits after the $(K-E=20)^{th}$ bit, which can be expressed as c=DAB139A0C2CCD3C516ED52 in hexadecimal system, $[r_1, r_2, \ldots r_i]=[1:4, 9:36, 41:96]$, and the corresponding generator matrix used to obtain the intermediate variable during decoding is $G'_{ldgc}=G_{ldgc}(1:L, [r_1, r_2, \ldots r_i])=G_{ldgc}(1:48, [1:4, 9:36, 41:96])$.

Figure 5:
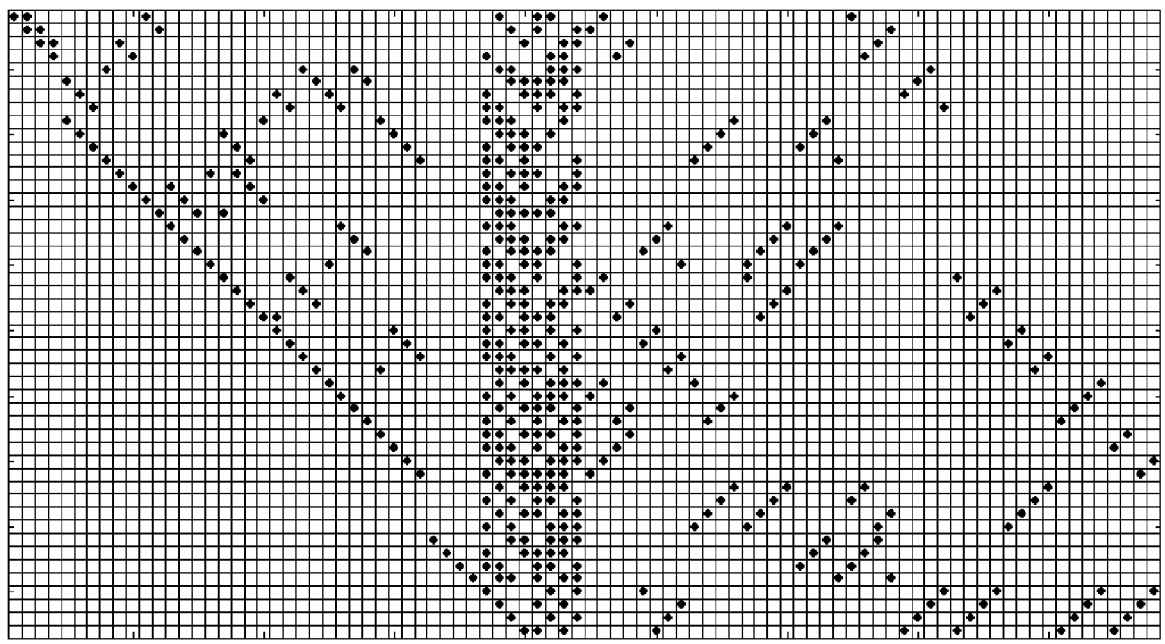
FIG. 5 is an illustration of a generator matrix of LDGCs that pass an erasure channel according to embodiments of the present invention.
Figure 6:
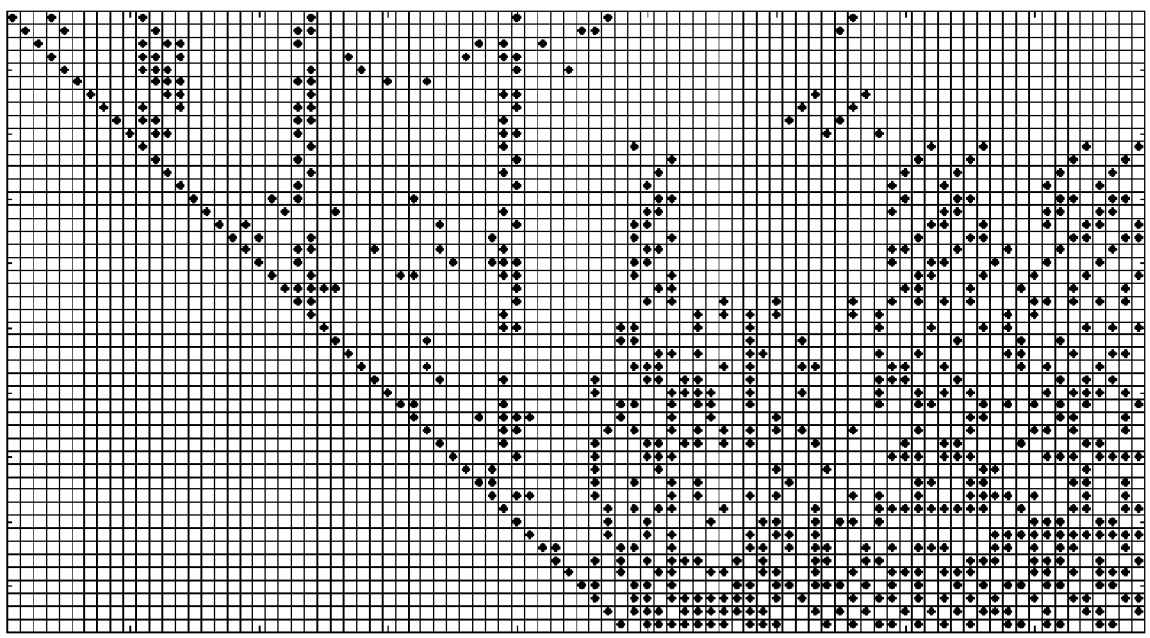
FIG. 6 is an illustration of an upper-right triangular matrix generated in a generator matrix of LDGCs utilizing a Gauss elimination method according to embodiments of the present invention.

An L*L=48*48 upper-right triangular matrix in $G'_{ldgc}$ is generated by the Gauss elimination method (FIG. 5 and FIG. 6 show the forms of the generator matrix $G'_{ldgc}$ before and after performing the special Gauss elimination method, respectively), and at the same time permutation and superposition of the reception code word are performed based on row permutation and row cancellation calculations to the matrix; and permutation of the intermediate variable is performed based on column permutation calculations to the matrix.

The intermediate variable I=942DA94E0A24 is obtained by solving the upper triangular equation employing the back substitution method, the signal flow m of length L is obtained according to $I*G_{ldgc}(1:L,1:L)=1*G_{ldgc}(1:48,1:48)=m$, and m is expressed as D8AB139A0C2C in hexadecimal system.

L−K=48−24=24 filled known bits are deleted to obtain the desired information bit s of length K=24, and s is expressed as D8AB13 in hexadecimal system.

Figure 7:
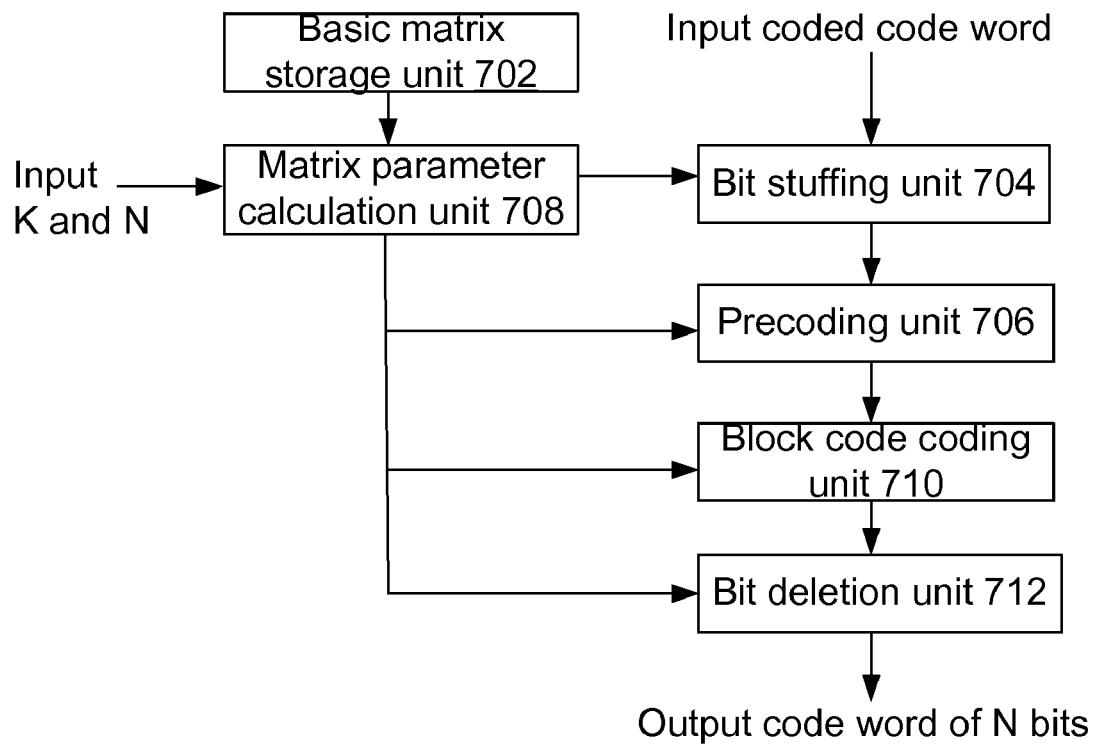
FIG. 7 is a block diagram of a coding device for LDGCs according to embodiments of the present invention.

According to FIG. 7, a coding device for low density generator matrix codes according to embodiments of the present invention is illustrated. As shown in FIG. 7, the coding device includes: a basic matrix storage unit 702, a bit stuffing unit 704, a precoding unit 706, a matrix parameter calculation unit 708, a block code coding unit 710 and a bit deletion unit 712. Wherein the basic matrix storage unit is used to store a uniform $k_b \times n_b$ basic matrix $G_b^{uniform}$ and to output the basic matrix to the matrix parameter calculation unit; wherein a square matrix $G_b^{uniform}(1:k_b,1:k_b)$ formed by $k_b$ rows and the first $k_b$ columns of the basic matrix is an upper triangular or a lower triangular matrix;

the bit stuffing unit is used to generate an information bit signal flow m of length L by adding L−K known bits to the to-be-coded information bit signal flow of length K and to output m to the precoding unit;

the precoding unit is used to generate the intermediate variable I using a square matrix $G_{ldgc}(1:L,1:L)$ formed by L rows and the first L columns of a generator matrix $G_{ldgc}$ and the information bit signal flow m of length L according to $I \times G_{ldgc}(1:L,1:L)=m$ and to output I to the block code coding unit;

the matrix parameter calculation unit is used to generate the matrices and parameters required by the block code coding unit as well as the parameters required by the bit stuffing unit and bit deletion unit; wherein first an expansion factor $$z_t = \frac{L}{k_b}$$

is determined, then the following magnitude relationship between $z_t$ and elements in Zset is determined: $z_{k-1} < z_t \leq z_k$, wherein $z_{k-1}, z_k$ are adjacent elements in size in Zset, and therefore $z_k$ is the expansion factor to be outputted; the modified basic matrix $G_b^{modified}$ can be obtained based on the uniform basic matrix $G_b^{uniform}$ and the expansion factor $z_k$ according to a particular modification algorithm; a generator matrix G' is obtained by expanding $G_b^{modified}$ using the expansion factor $z_k$, the column weight of $G'(:,L-z_k:L+z_k)$ is increased by modifying the $(L-z_k)^{th}$ to $(L+z_k)^{th}$ columns of G' (i.e. increasing the number of elements 1 in the columns), and the modified matrix is $G_{ldgc}$; and the generator matrix $G_{ldgc}(1:L,1:N+L-K)$, the expansion factor $z_k$ and matrix magnitude parameters K, L and N are inputted into the block code coding unit, the bit stuffing unit and the bit deletion unit.

The block code coding unit is used to code an information packet based on the matrices and parameters generated by the matrix parameter calculation unit, and to generate and output code words to the bit deletion unit.

The bit deletion unit is used to delete L−K known bits previously filled in the coded code words and to output N code words obtained through deletion.

Figure 8:
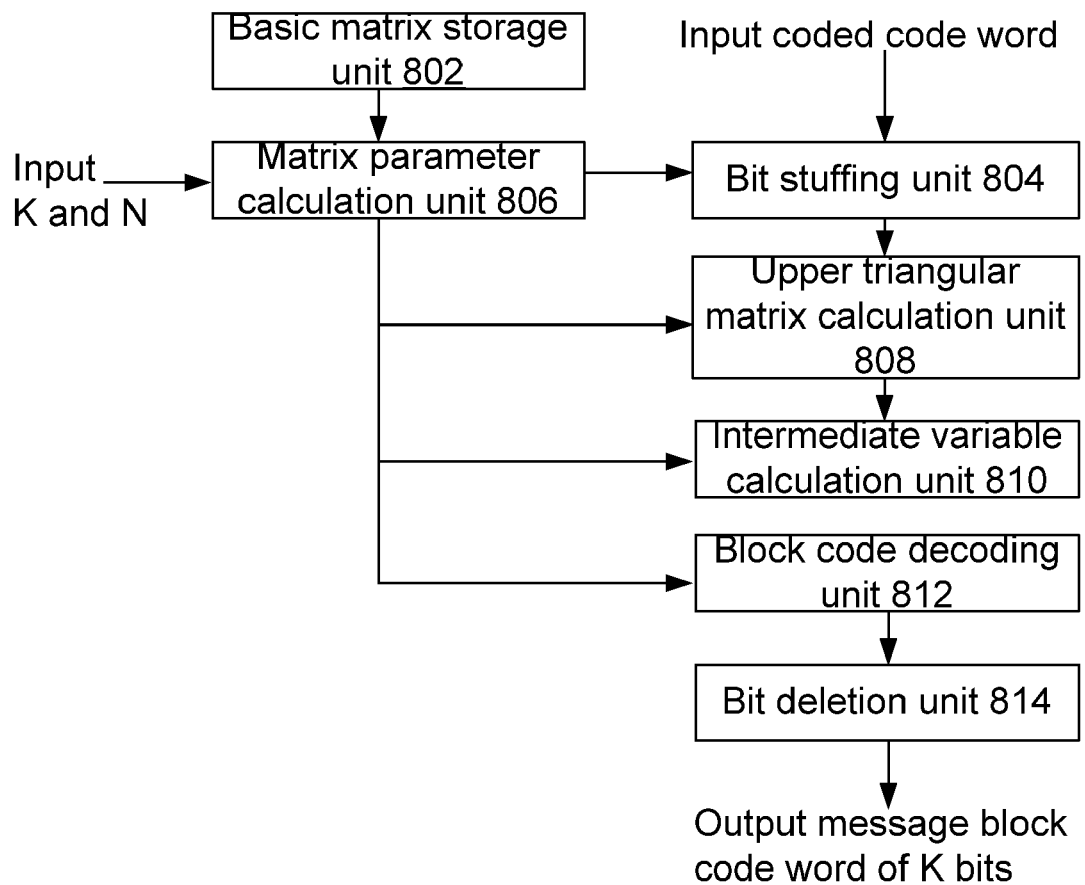
FIG. 8 is a block diagram of a decoding device for LDGCs according to embodiments of the present invention.

According to FIG. 8, a decoding device for low density generator matrix codes according to embodiments of the present invention is illustrated. As shown in FIG. 8, the decoding device includes: a basic matrix storage unit 802, a bit stuffing unit 804, a matrix parameter calculation unit 806, an upper triangular matrix calculation unit 808, an intermediate variable calculation unit 810, a block code decoding unit 812, and a bit deletion unit 814. Wherein the basic matrix storage unit is used to store a uniform $k_b \times n_b$ basic matrix $G_b^{uniform}$ and to output the basic matrix to the matrix parameter calculation unit;

the bit stuffing unit is used to construct an input signal flow $C(r_1, r_2, \ldots r_i) = [C_{r1}, C_{r2}, C_{r3}, \ldots, C_{ri}]$ of the decoder by filling L−K known bits in a reception bit signal flow that has passed an erasure channel, wherein i is a positive integer and $L \leq i \leq N+L-K$;

the matrix parameter calculation unit is used to generate the matrices and parameters required by the block code decoding unit and the upper triangular matrix calculation unit as well as the parameters required by the bit stuffing unit, the bit deletion unit; first, an expansion factor $$z_t = \frac{L}{k_b}$$

is determined, then the following magnitude relationship $z_{k-1} < z_t \leq z_k$ existing between $z_t$ and elements in Zset is determined, wherein $z_{k-1}, z_k$ are the adjacent elements in size in Zset, and therefore $z_k$ is the expansion factor to be outputted; the modified basic matrix $G_b^{modified}$ can be obtained based on the uniform basic matrix $G_b^{uniform}$ and the expansion factor $z_k$ according to a particular modification algorithm; a generator matrix G is obtained by expanding $G_b^{moddified}$ using the expansion factor $z_k$, a matrix $G_{ldgc}(1:L, r_1, r_2, \ldots r_i)$ is constructed using L rows of the generator matrix and the columns to which the serial numbers of the received bit signal flows correspond, and is inputted into the upper triangular matrix calculation unit; the generator matrix $G_{ldgc}(1:L,1:N+L-K)$ and the expansion factor $z_k$ are inputted into the block code decoding unit, and the matrix magnitude parameters K, L and N are inputted into the bit stuffing unit and the bit deletion unit.

The upper triangular matrix calculation unit is used to generate an L*L upper triangular matrix in $G_{ldgc}(:, r_i, r_2, \ldots r_i)$ and to output it to the intermediate variable calculation unit; wherein first a row with the smallest row weight (the number of elements 1 in the row) in $G_{ldgc}(j:L, r_1, r_2, \ldots r_i)$ is selected to perform row exchange with the $j^{th}$ row; column exchange between a column where the first nonzero element of the $j^{th}$ row resides and the $j^{th}$ column of the matrix is performed; and elements of the $j^{th}$ row and the $j^{th}$ column are used to eliminate the nonzero elements between the $(j+1)^{th}$ row and the last row in the $j^{th}$ column by employing the row cancellation method; then, permutation and superposition of the reception code words are performed based on row permutation and row cancellation calculations to a matrix comprising the L*L upper triangular matrix; permutation of the marshaling sequence of the intermediate variables is performed based on column permutation calculations to the matrix comprising the L*L upper triangular matrix; and the generated upper triangular matrix, the new reception code words and the marshaling sequence of the intermediate variables are inputted into the intermediate variable calculation unit.

The intermediate variable calculation unit is used to obtain the 1*L intermediate variable I by solving the upper triangular equation by employing the back substitution method according to $C(:, r_1, r_2, \ldots r_i) = I * G_{ldgc}(1:L, r_1, r_2, \ldots r_i)$.

The block code decoding unit is used to code a binary bit signal flow inputted by a decoding device using the matrices and parameters generated by the matrix parameter calculation unit, to obtain the signal flow m of length k+d according to $I*G_{ldgc}(:, 1:L) = m$, and to output it to the bit deletion unit.

The bit deletion unit is used to delete a certain number of code word bits in coded code words and to output K code words obtained through deletion.

The above description are just the preferred embodiments of the present invention, and are not used to restrict the present invention; to those skilled in the art, the present invention can have various changes and variations. Any and all modifications, equivalent substitutes, and improvements, etc, made within the principle of the present invention shall all be included into the scope of claims of the present invention.

What is claimed is:

1. A coding method for low density generator matrix codes including the following steps:

step I, constructing a mother code set of low density generator matrix codes by using P low density generator matrix codes of different code lengths at a code rate $R_0$, wherein the mother code set of low density generator matrix codes has a uniform basic matrix $G_b^{uniform}$, $$R_0 = \frac{k_b}{n_b},$$

$k_b$ is a row number of the basic matrix, and $n_b$ is a column number of the basic matrix;

step II, obtaining a length L of an intermediate variable according to the relationship between a length K of a to-be-coded information bit sequence in the mother code set of low density generator matrix codes and the length L of the intermediate variable;

step III, obtaining an expansion factor $z_k$ used for processing the basic matrix by utilizing the length L of the intermediate variable and the row number $k_b$ of the basic matrix, and obtaining a generator matrix $G_{ldgc}$ by modifying and expanding the basic matrix using the expansion factor $z_k$; and step IV, coding the to-be-coded information bit sequence using a matrix $G_{ldgc}(1:L,1:N+L-K)$ formed by L rows and the first N+L−K columns of the generator matrix, and sending the coded information bit sequence to a receiving end.

2. The coding method according to claim 1, wherein in the step II, the length L of the intermediate variable is obtained by using the length K of the to-be-coded information bit sequence through a formula L=modify(a×K+b), where modify( ) means rounding modification, the modification method can be ceil, floor or round, a is a positive rational number slightly greater than 1, and b is a positive integer.

3. The coding method according to claim 2, wherein the step III includes the following steps:

step a, obtaining an expansion factor $Z_t$ by using the length L of the intermediate variable and the row number $k_b$ of the basic matrix through a formula $$z_t = \frac{L}{k_b},$$

and finding out the expansion factor $z_k$ from an expansion factor set Zset that corresponds to the mother code set of low density generator matrix codes and consists of P greater-thanzero positive integers $z_1<z_2<\ldots<z_{k-1}<z_k<\ldots<z_P$ where the expansion factor $z_k$ is used for processing the basic matrix and has the following relationship with the expansion factor Z1; $z_{k-1}<z_t\leq z_k$;

step b, obtaining a modified basic matrix $G_b^{modified}$ by modifying the basic matrix using the expansion factor $z_k$ used for processing the basic matrix;

step c, obtaining an unmodified generator matrix G' by expanding the modified basic matrix using the expansion factor $z_k$ used for processing the basic matrix; and step d, obtaining the generator matrix $G_{ldgc}$ by modifying the unmodified generator matrix G'.

4. The coding method according to claim 3, wherein the step IV includes the following steps:

step e, generating an information bit sequence m of length L by filling L−K known bits in the to-be-coded information bit sequence;

step f, obtaining the intermediate variable I using a square matrix $G_{ldgc}(1:L,1:L)$ formed by L rows and the first L columns of the generator matrix and the information bit sequence m of length L according to a formula $I \times G_{ldgc}(1:L,1:L)=m$, and generating a first coding result of length N+L−K by coding the intermediate variable using a matrix $G_{ldgc}(1:L,1:N+L-K)$ formed by L rows and the first N+L−K columns of the generator matrix according to a formula $C=I \times G_{ldgc}$; and step g, generating a second coding result of length N by deleting the L−K known bits from the first coding result of length N+L−K.

5. The coding method according to claim 1, wherein the row number $k_b$ of the basic matrix is an integer greater than 2, and the column number $n_b$ of the basic matrix is an integer greater than or equal to 1.

6. The coding method according to claim 5, wherein in the step d, the generator matrix $G_{ldgc}$ is obtained by increasing column weight of certain columns of the unmodified generator matrix G'.

7. A coding device for low density generator matrix codes, including:

a basic matrix storage unit, which is used to store a uniform basic matrix $G_b^{uniform}$ of a mother code set of low density generator matrix codes constructed by P low density generator matrix codes of different code lengths at a code rate $R_0$, wherein $$R_0 = \frac{k_b}{n_b},$$

$k_b$ is a row number of the basic matrix, and $n_b$ is a column number of the basic matrix;

a matrix parameter calculation unit, which is used to calculate a length L of an intermediate variable according to the relationship between a length K of a to-be-coded information bit sequence in the mother code set of low density generator matrix codes and the length L of the intermediate variable, to calculate an expansion factor $z_k$ used for processing the basic matrix by utilizing the length L of the intermediate variable and the row number $k_b$ of the basic matrix, and to obtain a generator matrix $G_{ldgc}$ by performing modification and expansion calculations to the basic matrix using the expansion factor $z_k$;

a bit stuffing unit, which is used to generate an information bit sequence m of length L by adding L−K known bits to the to-be-coded information bit sequence;

a precoding unit, which is used to obtain the intermediate variable I using a square matrix $G_{ldgc}(1:L,1:L)$ formed by L rows and the first L columns of the generator matrix and the information bit sequence m of length L according to a formula $I \times G_{ldgc}(1:L,1:L)=m$;

a block code coding unit, which is used to generate a first coding result of length N+L−K by coding the intermediate variable using a matrix $G_{ldgc}(1:L,1:N+L-K)$ formed by L rows and the first N+L−K columns of the generator matrix; and a bit deletion unit, which is used to generate a second coding result of length N by deleting the L−K known bits from the first coding result of length N+L−K.

8. The coding device according to claim 7, wherein a square matrix $G_b^{uniform}(1:k_b,1:k_b)$ formed by $k_b$ rows and the first $k_b$ columns of the basic matrix is an upper triangular or a lower triangular matrix.

9. The coding device according to claim 8, wherein the matrix parameter calculation unit obtains an expansion factor $Z_t$ by using the length L of the intermediate variable and the row number $k_b$ of the basic matrix through a formula $$z_t = \frac{L}{k_b},$$

and obtains the $z_k$ used for processing the basic matrix by finding out the expansion factor that has the following relationship with the expansion factor $Z_t$ from an expansion factor set Zset that corresponds to the mother code set of low density generator matrix codes and consists of P greater-than-zero positive integers $z_1<z_2<\ldots<z_{k-1}<z_k<\ldots<z_P; z_{k-1}<z_t\leq z_k$.

10. The coding device according to claim 9, wherein the matrix parameter calculation unit obtains a modified basic matrix $G_b^{modified}$ by modifying the basic matrix using the expansion factor $z_k$ used for processing the basic matrix, obtains an unmodified generator matrix G' by expanding the modified basic matrix using the expansion factor $z_k$ used for processing the basic matrix, and then obtains the generator matrix $G_{ldgc}$ by modifying the unmodified generator matrix G'.

11. The coding device according to claim 10, wherein the matrix parameter calculation unit modifies the unmodified generator matrix G' by increasing column weight of certain columns of the unmodified generator matrix G'.

12. A decoding method for low density generator matrix codes including the following steps:

step I, obtaining a reception generator matrix $G_{ldgc}(:, r1, r2, \ldots ri)$ by modifying and expanding a basic matrix $G_b^{uniform}$ using an expansion factor $z_k$ used during a coding process;

step II, receiving a coded low density generator matrix code via an erasure channel, obtaining a to-be-decoded low density generator matrix code $C(r1, r2, \ldots ri)=[Cr1, Cr2, Cr3, \ldots, Cri]$ by filling L−K known bits in the coded low density generator matrix code that has passed the erasure channel, where i is a positive integer satisfying $L\leq i\leq N+L-K$, L is a length of an intermediate variable used during the coding process, N is a length of a coded low density generator matrix code that has not passed the erasure channel, and K is a length of a prior-to-coding low density generator matrix code;

step III, obtaining a 1*L reception intermediate vector I by using the reception generator matrix and the to-be-decoded low density generator matrix code according to a formula $C(:, r1, r2, \ldots ri)=I*G_{ldgc}(:, r1, r2, \ldots ri)$;

step IV, obtaining a decoding result m of length L by using a square matrix $G_{ldgc}(1:L,1:L)$ formed by L rows and the first L columns of the reception generator matrix and the reception intermediate vector according to a formula $I/G_{ldgc}(1:L,1:L)=m$; and step V, obtaining a decoding result of length K by deleting the L−K known bits from the decoding result m of length L, and outputting the decoding result for subsequent processing.

13. The decoding method according to claim 12, wherein the reception generator matrix has retained column vectors which correspond to serial numbers of all non-erasure positions in a matrix $G_{ldgc}(1:L,1:N+L-K)$ formed by L rows and the first N+L−K columns of a generator matrix used during the coding process.

14. The decoding method according to claim 13, wherein the step III includes the following steps:

step a, obtaining a matrix comprising an L*L upper triangular matrix by performing row permutation, column permutation and/or row cancellation calculations to the reception generator matrix $G_{ldgc}(:, r1, r2, \ldots ri)$ by employing a Gauss elimination method;

step b, performing permutation and superposition to the to-be-decoded low density generator matrix code and performing permutation to the intermediate variable used during the coding process based on the matrix comprising the L*L upper triangular matrix; and step c, obtaining the reception intermediate vector I by solving the upper triangular recursion equation based on a back substitution method.

15. The decoding method according to claim 14, wherein the step a includes the following steps:

selecting a row with the smallest row weight in the reception generator matrix to perform row exchange with the $j^{th}$ row;

performing column exchange between a column where the first nonzero element of the $j^{th}$ row in an after-row reception generator matrix resides and the $j^{th}$ column of the after-row-exchange reception generator matrix; and using elements of the $j^{th}$ row and the $j^{th}$ column of the after-column-exchange reception generator matrix to eliminate the nonzero elements between the $(j+1)^{th}$ row and the last row in the $j^{th}$ column of the after-column-exchange reception generator matrix by employing the row cancellation method.

16. A decoding device for low density generator matrix codes, including:

a basic matrix storage unit, which is used to store a uniform basic matrix $G_b^{uniform}$ of a mother code set of low density generator matrix codes constructed by P low density generator matrix codes of different code lengths at a code rate $R_0$, where $$R_0 = \frac{k_b}{n_b},$$

$k_b$ is a row number of the basic matrix, and $n_b$ is a column number of the basic matrix;

a matrix parameter calculation unit, which is used to obtain a reception generator matrix $G_{ldgc}(:, r1, r2, \ldots ri)$ by modifying and expanding the basic matrix $G_b^{uniform}$ using an expansion factor $z_k$ used during a coding process;

a bit stuffing unit, which is used to obtain a to-be-decoded low density generator matrix code $C(r1, r2, \ldots ri)=[Cr1,$ Cr2, Cr3, …, Cri] by filling L−K known bits in a coded low density generator matrix code that has passed an erasure channel, where i is a positive integer satisfying L≤i≤N+L−K, L is a length of an intermediate variable used during the coding process, N is a length of a coded low density generator matrix code that has not passed the erasure channel, and K is a length of a prior-to-coding low density generator matrix code;

an upper triangular matrix calculation unit, which is used to obtain a matrix comprising an L*L upper triangular matrix by performing row permutation, column permutation and/or row cancellation calculations to the reception generator matrix $G_{ldgc}(:, r1, r2, \ldots ri)$ by employing a Gauss elimination method;

an intermediate variable calculation unit, which is used to obtain a 1*L reception intermediate vector I by utilizing the matrix comprising the L*L upper triangular matrix and the to-be-decoded low density generator matrix code according to a formula $C(:, r1, r2, \ldots ri)=I*G_{ldgc}(:, r1, r2, \ldots ri)$;

a block code decoding unit, which is used to obtain a decoding result m of length L by utilizing a square matrix $G_{ldgc}(1:L,1:L)$ formed by L rows and the first L columns of the reception generator matrix and the reception intermediate vector according to formula $I*G_{ldgc}(1:L,1:L)=m$; and a bit deletion unit, which is used to obtain a decoding result of length K by deleting the L−K known bits from the decoding result m of length L.

17. The decoding device according to claim 16, wherein the matrix parameter calculation unit obtains an expansion factor $Z_t$ by utilizing the length L of the intermediate variable used during the coding process and the row number $k_b$ of the basic matrix through formula $$z_t = \frac{L}{k_b},$$

and obtains the expansion factor $z_k$ used during the coding process by finding out the expansion factor that has the following relationship with the expansion factor $Z_t$ from an expansion factor set Zset that corresponds to the mother code set of low density generator matrix codes and consists of P greater-than-zero positive integers $z_1 < z_2 < \ldots < z_{k-1} < z_k < \ldots < z_p$: $z_{k-1} < z_t \leq z_k$.

18. The decoding device according to claim 17, wherein the matrix parameter calculation unit obtains a modified basic matrix $G_b^{modified}$ by modifying the basic matrix using the expansion factor $z_k$ used during the coding process, obtains a basic generator matrix G by expanding the modified basic matrix using the expansion factor $z_k$ used during the coding process, and then generates the reception generator matrix by using L rows and columns corresponding to the serial numbers of the to-be-decoded low density generator matrix codes of the basic generator matrix G.

19. The decoding device according to claim 18, wherein the upper triangular matrix calculation unit obtains the matrix comprising the L*L upper triangular matrix by selecting a row with the smallest row weight in the reception generator matrix to perform row exchange with the $j^{th}$ row, performing column exchange between a column where the first nonzero element of the $j^{th}$ row in an after-row-exchange reception generator matrix resides and the $j^{th}$ column of the after-row-exchange reception generator matrix, and using elements of the $j^{th}$ row and the $j^{th}$ column of the after-column-exchange reception generator matrix to eliminate the nonzero elements between the $(j+1)^{th}$ row and the last row in the $j^{th}$ column of the after-column-exchange reception generator matrix using the row cancellation method.

20. The decoding device according to claim 16, wherein under circumstances that the square matrix $G_{ldgc}(1:L,1:L)$ formed by L rows and the first L columns of the reception generator matrix is an upper-left triangular matrix or a lower-left triangular matrix, the L−K known bits are filled before the coded low density generator matrix code that has passed the erasure channel.

21. The decoding device according to claim 16, wherein under circumstances that the square matrix $G_{ldgc}(1:L,1:L)$ formed by L rows and the first L columns of the reception generator matrix is an upper-right triangular matrix or a lower-right triangular matrix, the L−K known bits are filled after K−E bits of the coded low density generator matrix code that has passed the erasure channel, where E is the number of erased code words in the first K code words after the coded low density generator matrix code that has not passed the erasure channel passes the erasure channel.

22. The coding method according to claim 2, wherein the row number $k_b$ of the basic matrix is an integer greater than 2, and the column number $n_b$ of the basic matrix is an integer greater than or equal to 1.

23. The coding method according to claim 3, wherein the row number $k_b$ of the basic matrix is an integer greater than 2, and the column number $n_b$ of the basic matrix is an integer greater than or equal to 1.

24. The coding method according to claim 4, wherein the row number $k_b$ of the basic matrix is an integer greater than 2, and the column number $n_b$ of the basic matrix is an integer greater than or equal to 1.

25. The coding method according to claim 22, wherein in the step d, the generator matrix $G_{ldgc}$ is obtained by increasing column weight of certain columns of the unmodified generator matrix G'.

26. The coding method according to claim 23, wherein in the step d, the generator matrix $G_{ldgc}$ is obtained by increasing column weight of certain columns of the unmodified generator matrix G'.

27. The coding method according to claim 24, wherein in the step d, the generator matrix $G_{ldgc}$ is obtained by increasing column weight of certain columns of the unmodified generator matrix G'.

28. The decoding device according to claim 17, wherein under circumstances that the square matrix $G_{ldgc}(1:L,1:L)$ formed by L rows and the first L columns of the reception generator matrix is an upper-left triangular matrix or a lower-left triangular matrix, the L−K known bits are filled before the coded low density generator matrix code that has passed the erasure channel.

29. The decoding device according to claim 18, wherein under circumstances that the square matrix $G_{ldgc}(1:L,1:L)$ formed by L rows and the first L columns of the reception generator matrix is an upper-left triangular matrix or a lower-left triangular matrix, the L−K known bits are filled before the coded low density generator matrix code that has passed the erasure channel.

30. The decoding device according to claim 19, wherein under circumstances that the square matrix $G_{ldgc}(1:L,1:L)$ formed by L rows and the first L columns of the reception generator matrix is an upper-left triangular matrix or a lower-left triangular matrix, the L−K known bits are filled before the coded low density generator matrix code that has passed the erasure channel.

31. The decoding device according to claim 17, wherein under circumstances that the square matrix $G_{ldgc}(1:L,1:L)$ formed by L rows and the first L columns of the reception generator matrix is an upper-right triangular matrix or a lower-right triangular matrix, the L−K known bits are filled after K−E bits of the coded low density generator matrix code that has passed the erasure channel, where E is the number of erased code words in the first K code words after the coded low density generator matrix code that has not passed the erasure channel passes the erasure channel.

32. The decoding device according to claim 18, wherein under circumstances that the square matrix $G_{ldgc}(1:L,1:L)$ formed by L rows and the first L columns of the reception generator matrix is an upper-right triangular matrix or a lower-right triangular matrix, the L−K known bits are filled after K−E bits of the coded low density generator matrix code that has passed the erasure channel, where E is the number of erased code words in the first K code words after the coded low density generator matrix code that has not passed the erasure channel passes the erasure channel.

33. The decoding device according to claim 19, wherein under circumstances that the square matrix $G_{ldgc}(1:L,1:L)$ formed by L rows and the first L columns of the reception generator matrix is an upper-right triangular matrix or a lower-right triangular matrix, the L−K known bits are filled after K−E bits of the coded low density generator matrix code that has passed the erasure channel, where E is the number of erased code words in the first K code words after the coded low density generator matrix code that has not passed the erasure channel passes the erasure channel.

\* \* \* \* \*